June 22, 1965 R. L. ANDERSON ETAL 3,190,773

VAPOR DEPOSITION PROCESS TO FORM A RETROGRADE IMPURITY DISTRIBUTION p-n JUNCTION FORMATION WHEREIN THE VAPOR CONTAINS BOTH DONOR AND ACCEPTOR IMPURITIES

Filed April 14, 1961

INVENTORS
RICHARD L. ANDERSON
JOHN C. MARINACE
MARY J. O'ROURKE INGHAM

BY Alvin J. Riddles
ATTORNEY

United States Patent Office 3,190,773
Patented June 22, 1965

3,190,773

VAPOR DEPOSITION PROCESS TO FORM A RETROGRADE IMPURITY DISTRIBUTION p-n JUNCTION FORMATION WHEREIN THE VAPOR CONTAINS BOTH DONOR AND ACCEPTOR IMPURITIES

Richard L. Anderson, Madrid, Spain, and John C. Marinace, Yorktown Heights, and Mary J. O'Rourke Ingham, Huntington, N.Y., assignors to International Business Machines Corporation, New York, N.Y., a corporation of New York Filed Apr. 14, 1961, Ser. No. 103,103
4 Claims. (Cl. 148—175)

This application is a continuation-in-part of application Serial No. 862,836, field December 30, 1959, now abandoned.

This invention relates to "p-n" junctions in semiconductor materials and in particular to the fabrication of semiconductor devices having a retrograde distribution of conductivity type determining impurities in the vicinity of a "p-n" junction therein.

In a semiconductor crystal, the distance that a depletion region associated with a biased "p-n" junction travels into the semiconductor crystal is governed by the impurity distribution in the portion of the crystal being traversed. The effect of the depletion region in a semiconductor device gives to a circuit a parameter that is similar to capacitance. Where the semiconductor device is provided with a junction having a retrograde distribution of impurities in the crystal adjacent to the junction, circuit performance similar to a large fractional change in capacitance with applied voltage is achieved. A retrograde distribution of impurities is defined as a distribution in which the density decreases as the distance from the junction increases. Such a semiconductor device is described in U.S. Patent 2,919,389 to W. Heywang et al., entitled "Semiconductor Arrangement for Voltage Dependent Capacitance."

What has been discovered is a method of manufacturing a semiconductor device containing a retrograde distribution by epitaxially growing semiconductor material on a semiconductor substrate by decomposing a halogen gaseous compound of the semiconductor material and during the growing changing from one conductivity type determining impurity in the vapor to another with an intermediate impurity material depositing step.

One of the principal uses developing in the art for a semiconductor device exhibiting a variable capacity with voltage is that of the parametric amplifier, well-known in the art.

It is a primary object of this invention to provide a semiconductor device having a retrograde impurity distribution in the vicinity of a "p-n" junction therein.

It is an object of this invention to provide a method for producing a retrograde distribution of impurities in a semiconductor device.

It is another object of this invention to provide a method of controlling the capacity of a deposited "p-n" junction.

It is another object of this invention to provide a method of making an improved variable capacity diode.

The foregoing and other objects, features and advantages of the invention will be apparent from the following more particular description of a preferred embodiment of the invention, as illustrated in the accompanying drawings.

Figure 1:
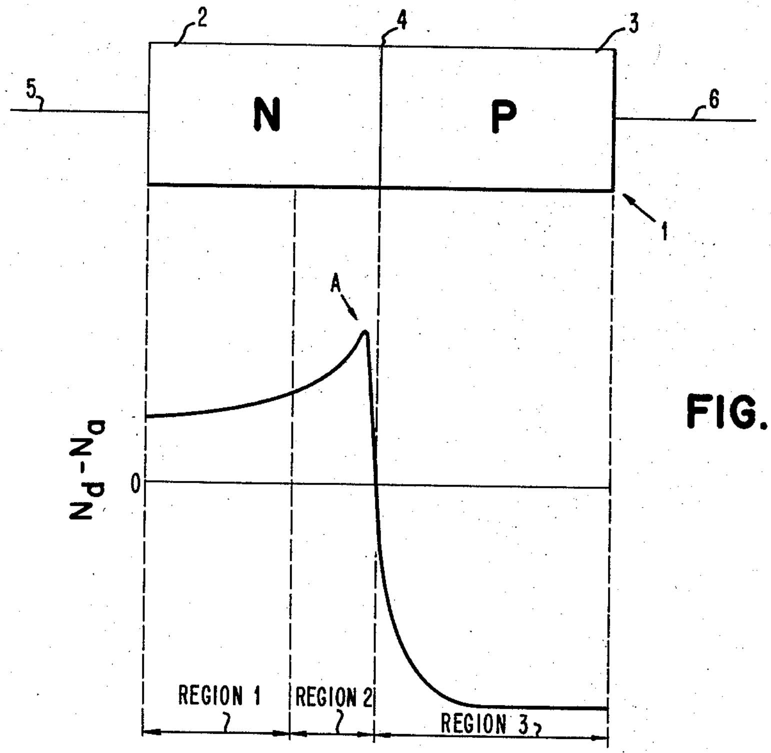
FIG. 1 is a schematic view of a semiconductor device containing a "p-n" junction accompanied by a dimensionally correlated graph of the impurity distribution therein showing a retrograde impurity distribution associated with the junction.

Referring now to FIG. 1, a single monocrystal of semiconductor material; for example, germanium, is shown containing therein two zones 2 and 3 of opposite conductivity types, shown for illustration as "n" and "p" type meeting at a "p-n" junction 4. Ohmic contacts are provided for future circuit connection purposes, contact 5 made to the "n" region 2, and contact 6 to the "p" region 3.

The crystal structure of FIG. 1 contains a distribution of conductivity type determining impurities that is retrograde in the vicinity of the junction. In other words, the quantity of conductivity type determining impurities present is greater at a point near the junction than at a position farther from the junction.

For most purposes, semiconductor diodes of the type illustrated in the structure, have a relatively constant distribution of impurities in the "n" region 2, and similarly, a relatively constant distribution of impurities in the "p" region 3. For each zone there is a predominance of the particular conductivity type determining impurity which gives the region its conductivity type. Some diode structures have a controlled distribution of conductivity type determining impurities in the vicinity of the junction for purposes, as previously mentioned, to control such features as avalanche breakdown. The retrograde impurity distribution type semiconductor device is distinguished from all prior devices in that referring to region 2 of the graph in FIG. 1, it may be seen that the variation of the concentration of conductivity type determining impurities, plotted in the graph as the number of donors $N_d$ minus the number of acceptors $N_a$, $(N_d-N_a)$, changes from a relatively constant value in region 1 to a greater quantity A in region 2 prior to going through zero at the junction.

The value of this structure may be appreciated by considering the fact that since the distance that a depletion region extends into the "n" region from the junction 4 under the influence of bias applied between terminals 5 and 6, is determined by the concentration of conductivity type determining impurities in the crystal adjacent to the junction 4, there will be a marked influence on the extent of this depletion region penetration when the turnover point "A" is reached on the curve in FIG. 1. A semiconductor junction having such a retrograde impurity distribution exhibits sharply non-linear response of decreased capacitance with applied voltage as the depletion region associated with junction 4 extends into the "n" region 2 beyond the point A.

It has been found that a retrograde impurity distribution may be placed in a semiconductor crystal by the technique of epitaxial vapor growth wherein a compound of a transport element and the semiconductor is decomposed to deposit the semiconductor material on a substrate. The technique of epitaxial vapor growth is described in a number of articles in the IBM Journal of Research and Development, Vol. 4, No. 3, July 1960, and the variable capacitance is described on pages 264–268 of the issue in an article entitled "A Vapor Grown Variable Capacitance Diode."

It has been found that retrograde impurity distribution "p-n" junction structures may be vapor grown having superior characteristics where certain steps are taken in accordance with the invention during the vapor growth operation.

Figure 2:
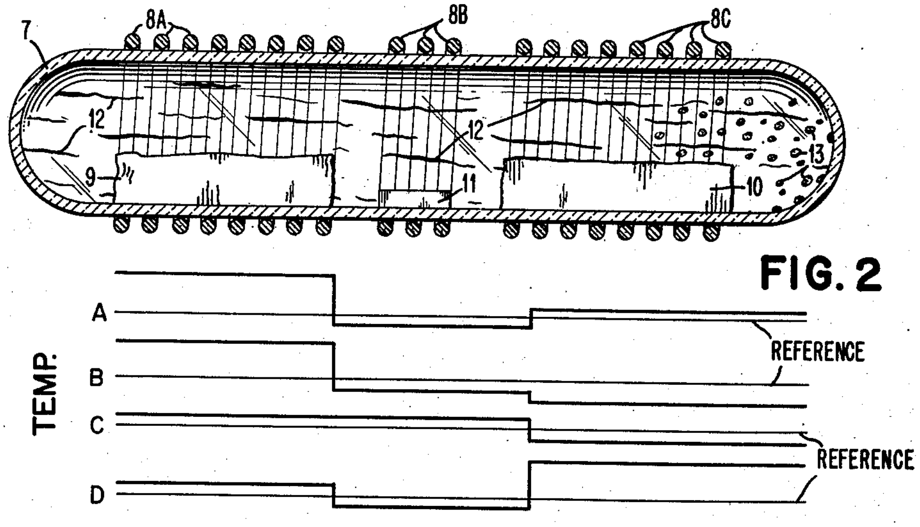
FIG. 2 is a schematic view of apparatus with a dimensionally correlated graph of the temperature therein used to produce a retrograde impurity distribution in a semiconductor crystal in accordance with the invention.

Referring now to FIG. 2, in accordance with the invention, a schematic diagram of one form of the vapor deposition process and the temperature profile maintained in connection therewith is provided. In FIG 2, an environment controlling sealed tube 7, such as quartz, is provided with a series of heating elements 8A, 8B, and 8C for example, of the resistance type involving Nichrome wire, which are capable of heating and controlling the temperature in discrete stations of the tube 7. A quantity of an "n" conductivity type source semiconductor material, for example germanium 9, is positioned in the region controlled by heating element 8A. A quantity of a "p" conductivity type germanium 10 is positioned in the region controlled by heating element 8C, and a substrate of monocrystalline semiconductor material 11 is positioned under heating element 8B. A quantity of a transport element, for example iodine, is introduced into the container 7 and in the intermediate stage of the deposition illustrated, the transport element enters a vapor 12 of the transport element and the particular source 9 or 10 being deposited.

In accordance with the invention, superior devices exhibiting a retrograde impurity distribution may be formed by depositing an impurity bearing solid material, and establishing an equilibrium wherein there is no significant deposition taking place during the change from one conductivity type impurity deposition to another and then vaporize the solid impurity bearing material and the opposite conductivity source together.

In operation, the chemical reaction within the tube 7 is such that by appropriate application of power to the various heating elements 8A through 8C, the entire tube 7 is raised to a reference temperature and the temperature is further selectively raised under the source semiconductor materials 9 and 10 while the substrate 11 is held at a temperature at which pyrolytic decomposition of the gas 12 occurs, thus for the chemical reaction $2GeI_2 \rightleftharpoons GeI_4 + Ge$ is the lowest temperature in the container 7. The temperature profile in the tube 7 for deposition of the "n" type source 9 on the substrate 11 using germanium and iodine is indicated by the curve A illustrating the source 9 being maintained at a temperature substantially above reference, the "p" type source 10 is maintained slightly above reference and the temperature under the substrate 11 is at the lowest temperature.

Under these conditions, the heated "n" type source semiconductor material 9 and the heated transport element will vaporize and form a gaseous compound 12. At a selected point, illustrated for germanium and iodine as the lowest temperature point, which is at the substrate 11, the compound 12 of the source 9 and the transport element will decompose and epitaxially deposit "n" conductivity type semiconductor material on the substrate.

Upon reaching a desired physical size for a portion of the region 1 of FIG. 1, a change in the temperature profile, such as shown in curve B of FIG. 2 is employed.

In accordance with curve B, the temperature of the source 9 is maintained sufficiently high to continue the deposition and the temperature under the source 10 is established at a small increment below that of the substrate 11. Under these conditions a small amount of a solid impurity bearing material 13 will condense in the region of the source 10. This material is shown in granular form in FIG. 2 and the walls of the container 7.

The reaction is next permitted to come to an equilibrium in which no significant deposition occurs by setting up a temperature profile as shown in connection with curve C wherein the source 9 and the substrate 11 are maintained at a temperature near reference and the region of the source 10 is maintained at a temperature slightly below reference to insure that the material 13 will remain solid.

Upon reaching an equilibrium, the temperature is raised under the source 10, as illustrated in curve D of FIG. 2, such that the source 9 is maintained slightly above reference, the substrate 11 is maintained slightly below reference at the lowest temperature point in the system to insure that the deposition will occur at that point and the temperature under the source 10 is raised to a substantial value above reference.

While the temperature of the source 10 is going up, the condensed solid impurity bearing material 13 is in the vicinity of the source 10 which was placed there in connection with curve B of FIG. 2 evaporates before the opposite conducivity type impurity concentration present in the source 10 becomes effective to predominate in the growing crystal 11 and to control conductivity type. Thus, after the steady impurity concentration in the crystal being grown on the substrate 11 as the temperature raises, a different level of impurity concentration can occur with increasing concentration until the opposite conductivity type impurity predominates.

When a change of temperature profile as illustrated from curve A to curve D is accomplished in setting up the vapor growth of one conductivity type semi-conductor material after a previous deposition of the opposite conductivity type on the substrate 11, the unique and useful effect of the invention occurs. It has been found that there is an initial rise in the quantity of the conductivity type determining impurity being deposited. This effect is illustrated in FIG. 1 for a deposition of "n" conductivity type material followed by a deposition of "p" conductivity type material wherein there is a rise in the number of donors over the number of acceptors to a turnover point A beyond which there is a decrease in the number of donors and increase in the number of acceptors until the number of donors equals the number of acceptors at which point a "p-n" junction 4 is formed, and further "p" material such as shown in the "p" region 3 of FIG. 1 is deposited as the number of acceptors continues to increase. This initial increase in the concentration of the conductivity type determining impurities before a decrease when a change in conductivity type is desired produces a retrograde impurity distribution in the deposited crystal.

It will be apparent that the deposition operation providing the retrograde impurity distribution of the invention may be reversed as soon as the junction is formed so as to provide the retrograde distribution on both sides of a junction. In other words, by reversing the order and conductivity type of the temperature profiles a distribution identical to the one shown on the "n" conductivity side on FIG. 1 may be provided. This is accomplished in accordance with the invention by setting up the temperature profile the opposite of that of curve B, then curve C, then curve A as soon as the junction is formed. The structure formed by such a vapor growth operation results in a retrograde distribution on both sides of the junction and this structure will be bilateral and will be substantially more sensitive to capacitance value for voltage changes.

In order to aid in understanding and practicing the invention, the following set of actual specifications is set forth to provide a starting place in a complicated technology for one skilled in the art. It being understood, however, that many sets of such specifications may be provided in light of the above teaching and that no limitations should be construed hereby.

A retrograde impurity distribution in accordance with the invention may be produced in a single semiconductor crystal by providing, in connection with FIG. 2, a quartz tube 7 of 22 millimeters inside diameter and 30 centimeters in length, having positioned, in discrete heat controllable locations therein corresponding to elements 8A, 8B and 8C, respectively, the following items:

In location 8A:

Phosphorous doped germanium 0.001 to 0.003 ohm-centimeter resistivity—ingot form—approximately 0.3 cubic inch.

In location 8B:

A monocrystalline germanium substrate—"n" conductivity type, approximately 0.02 ohm-centimeter resistivity—0.020 inch square, 0.005 inch thick.

In location 8C:

Boron doped germanium 0.01 ohm-centimeter resistivity—ingot form—approximately 0.3 cubic inch.

The tube 7 is evacuated to $10^{-5}$ mm. Hg with 152 milligrams of iodine inserted.

The temperature profile described by the curve A for the vapor growth of "n" conductivity type germanium on the substrate 11 is such that element 9 is maintained at approximately 550°, the substrate 11 is maintained at about 420° C., and the "p" conductivity type source is at approximately 425° C.

This is maintained for a time sufficient to grow a portion of the region 1 of FIG. 1 and may be from 1 to 50 hours dependent on the growth rate. The temperature profile described by the curve B for the deposition of the solid impurity bearing material 13 in the region of the "p" conductivity type germanium 10 is such that the element 10 is at approximately 415° C. while substrate 11 is maintained at about 420° C. and the element 9 remains at about 550° C. This profile is maintained until a sufficient solid impurity bearing material 13 is deposited to provide the retrograde junction. This is related to the size of the tube 7 and for the size in this example, approximately 1 hour is appropriate.

The temperature profile described by the curve C provides an intermediate cooling step. In this step the region containing the solid impurity bearing material 13 is maintained sufficiently below the remainder of the system to prevent return to the vapor 12. This cooling step may be maintained until equilibrium is established which may be for approximately 1 hour.

The temperature profile described by the curve D provides the retrograde impurity distribution. As the temperature under the region 10 rises, the solid impurity bearing material 13 is driven into the vapor 12. This operates to raise the concentration of the phosphorus in the vapor 12 before the boron from the source 10 reaches a concentration high enough to predominate. The more slowly the temperature rises, the larger will be the physical distance of the region 2 of FIG. 1. The temperature of the region 10 is brought up to the temperature of curve D in approximately 5 minutes and growth is continued until a region 3 as shown in FIG. 1 of desired size is formed.

It will be apparent to one skilled in the art that various adjustments in actual temperature values will be advantageously compatible with the quantities used, the vapor pressures of the particular elements and the voltages to be handled by the ultimate structure. For example, the element arsenic requires much less heat to vaporize. The important item is to set up a temperature profile that causes a pyrolytic decomposition of a compound of the source and the transport element in the vicinity of the substrate and during deposition, deposit impurity bearing material, establish equilibrium and then change the predominance of one conductivity type determining impurity over the other. As a result of this change in accordance with the invention, the concentration of the impurity being deposited will first increase then decrease toward a junction thereby producing a retrograde impurity distribution.

The retrograde impurity distribution near a "p-n" junction of the invention may best be appreciated through the following discussion of the effect on the capacitance of the device of FIG. 1 as a result of the retrograde distribution impurities therein.

As has been generally stated in the art, the capacity of a semiconductor device is related to the distance into the crystal from the "p-n" junction, that a depletion region associated with a bias across the junction travels under the influence of that bias. It has been further established in the art that the concentration of conductivity type determining impurities in the region traversed by the depletion region governs the distance into the crystal the depletion region traverses. Let a "p-n" junction be considered in which the concentration of conductivity type determining impurities in the "n" region, for example, zone 2 of FIG. 1, is less than that in the "p" region 3, so that most of the transition region occurs on the "n" side of the junction. Analogous results to what is to be discussed will occur for the opposite case and for impurity concentrations on both sides of the junction, but this assumption will make the following calculations easier to follow.

For a graded junction where the impurity concentration, the doping of donors, increases with a distance $x$ from the junction, it may be stated that:

*Equation 1*

$$N_D \sim x^n$$

and where $n$ is not negative, it can be shown that the transition capacity is:

*Equation 2*

$$C \sim (V_D - V)^{\frac{-1}{n+2}} = (V_D - V)^{-\alpha}$$

For a large value of $n$ the capacity is almost independent of voltage. For the extreme case where $n$ is equal to zero there is an abrupt junction and:

*Equation 3*

$$C \sim (V_D - V)^{-1/2}$$

where $V_D$ is the diffusion voltage and V is the applied voltage, V is considered negative for a reverse voltage.

It will be apparent from the above that if $N_D$ at the edge of the transition region can be made to decrease as distance from the junction is increased, the value of alpha can be made larger than one half. In other words, referring to FIG. 1, if a turnover point A can be provided in the impurity distribution as the depletion region advances in the direction of A from the junction 4, the value of alpha in Equation 2 can be made larger than one half. For a larger value of alpha, the concentration gradient must be large and negative at the edge of the transition region. In addition, the concentration must not extend too deep into the semiconductor device or the series resistance will be too large and the "Q" of the device will be degraded. The rate of change of impurity concentration with distance from the junction determines the exact value of alpha and, as has been described in connection with the method above, depending upon relative impurity concentration and the quantity of semiconductor material introduced into the deposition reaction tube, the value of alpha can be controlled for different purposes. Variable capacity semiconductor devices having large or small values of alpha may be desirable under different operation conditions.

In order to provide a starting place for one skilled in the art, fabrication of a retrograde impurity distribution improved variable capacity diode, the following set of specifications are provided, it being understood that no limitation is to be construed hereby since in the light of the foregoing disclosure other such sets of specifications may be provided.

Referring to FIG. 1, the diode 1 is composed of monocrystalline germanium having a phosphorus impurity concentration such that the resistivity of the crystal throughout region 1 is approximately 0.05 ohm-centimeter decreasing to approximately 0.01 ohm-centimeter at the turnover point A in region 2 and then increasing through intrinsic at the "p-n" junction 4 and to less than 0.01 ohm-centimeter in region 3, wherein a gallium conductivity type determining impurity has been introduced. Ohmic connections 5 and 6 are made employing tin-antimony solder in the case of contact 5 and indium in the case of contact 6. The physical dimensions of the crystal 1 are approximately 20 thousandths of an inch in diameter and approximately 10 thousandths of an inch between contact 5 and contact 6.

What has been described is a technique of fabricating a semiconductor device having a retrograde distribution of impurities in the vicinity of a "p-n" junction therein, so that a device is achieved that has a controllable variation of capacity with voltage, such as is suitable for a parametric amplifier.

While the invention has been particularly shown and described with reference to a preferred embodiment thereof, it will be understood by those skilled in the art that various changes in form and details may be made therein without departing from the spirit and scope of the invention.

What is claimed is:

1. The method of providing a variable capacity diode comprising the steps of providing a substrate of semiconductor material, epitaxially growing semiconductor material including a first conductivity type determining impurity on said substrate, and, in the course of said growing step, depositing in a vaporizable location a source of a solid first conductivity type impurity bearing material establishing an equilibrium during which no significant vapor growth takes place and thereafter simultaneously vaporizing said source of solid first conductivity type impurity bearing material and a source of an opposite conductivity type semiconductor material.

2. The method of providing a retrograde impurity distribution in an epitaxially vapor grown body of a semiconductor material comprising the steps of positioning in a sealed container a first conductivity type laden source of semiconductor material, a monocrystalline substrate of a semiconductor material and an opposite type conductivity type impurity laden source of semiconductor material, each in separate discrete locations in the presence of a vapor of a compound of a transport element and a semiconductor material vapor growing a first conductivity type portion on said semiconductor substrate and during said vapor growth depositing in a portion of said container in the vicinity of the location of said opposite conductivity type determining impurity laden semiconductor source a quantity of a solid first conductivity type impurity bearing material, establishing an equilibrium during which no significant vapor growth takes place, simultaneously vaporizing said solid first conductivity type impurity type bearing material and said opposite conductivity type impurity laden source of semiconductor material and vapor growing a quantity of semiconductor material on said first grown portion of said semiconductor material on said substrate.

3. The method of providing a retrograde impurity distribution in a vapor grown body of germanium comprising the steps of positioning in a sealed container a first conductivity type laden source of germanium, a monocrystalline substrate of germanium and an opposite type conductivity type impurity laden source of germanium, each in separate discrete locations in the presence of a vapor of a compound of a transport element and germanium, epitaxially vapor growing a first conductivity type portion on said germanium substrate and during said vapor growth depositing in a portion of said container in the vicinity of the location of said opposite conductivity type determining impurity laden germanium source a quantity of a solid first conductivity type impurity bearing material, establishing an equilibrium during which no significant vapor growth takes place, simultaneously vaporizing said solid first conductivity type impurity type bearing material and said opposite conductivity type impurity laden source of germanium and vapor growing a quantity of germanium on said first grown portion of said germanium on said substrate.

4. The method of providing a retrograde impurity distribution in a vapor grown body of germanium comprising the steps of positioning in a sealed container a phosphorus laden source of germanium, a monocrystalline substrate of germanium and a boron laden source of germanium, each in separate discrete locations in the presence of a vapor of a compound of a transport element and germanium epitaxially vapor growing a phosphorus bearing portion on said germanium substrate and during said vapor growth depositing in a portion of said container in the vicinity of the location of said boron laden germanium source a quantity of a solid phosphorus bearing material, establishing an equilibrium during which no significant vapor growth takes place, simultaneously vaporizing said solid phosphorus bearing material and said boron laden source of germanium and epitaxially vapor growing a quantity of germanium on said first grown portion of said germanium on said substrate.

References Cited by the Examiner

UNITED STATES PATENTS

| | | | |
|---|---|---|---|
| 2,692,839 | 10/54 | Christensen et al. | 148—1.5 |
| 2,701,216 | 2/55 | Seiler | 148—1.5 |
| 2,763,581 | 9/56 | Freedman | 148—1.5 |
| 2,873,222 | 2/59 | Derick et al. | 148—1.5 |
| 2,895,858 | 7/59 | Sangster | 148—1.5 |
| 2,898,248 | 8/59 | Silvey et al. | 148—1.5 |
| 2,910,394 | 10/59 | Scott et al. | 148—1.5 |

FOREIGN PATENTS 1,029,941 5/58 Germany.

OTHER REFERENCES

IBM Technical Disclosure Bulletin, vol. 3, No. 4, September 1960, pages 32 and 33.

DAVID L. RECK, *Primary Examiner.*

OSCAR R. VERTIZ, CARL D. QUARFORTH, *Examiners.*